United States Patent
Chen

(10) Patent No.: US 7,777,564 B2
(45) Date of Patent: Aug. 17, 2010

(54) AMPLIFIER USING SIGMA-DELTA MODULATION AND METHOD FOR ADJUSTING ERRORS OF THE AMPLIFIER THEREOF

(75) Inventor: Kuo-Hsin Chen, Taipei (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 12/477,119

(22) Filed: Jun. 2, 2009

(65) Prior Publication Data

US 2009/0302937 A1    Dec. 10, 2009

(30) Foreign Application Priority Data

Jun. 4, 2008    (TW) .............................. 97120713 A

(51) Int. Cl.
*H03F 3/38* (2006.01)
(52) U.S. Cl. ........................................ 330/10; 330/251
(58) Field of Classification Search .................. 330/10, 330/251, 207 A
See application file for complete search history.

(56) References Cited

U.S. PATENT DOCUMENTS

| 6,836,231 B2 * | 12/2004 | Pearson ....................... 341/143 |
| 7,102,431 B2 * | 9/2006 | Bier ............................ 330/251 |
| 7,432,759 B2 * | 10/2008 | Cho et al. ....................... 330/10 |
| 7,548,110 B2 * | 6/2009 | Lin .............................. 330/10 |

* cited by examiner

*Primary Examiner*—Henry K Choe
(74) *Attorney, Agent, or Firm*—Winston Hsu

(57) ABSTRACT

An amplifier includes a sigma-delta modulating circuit, a power stage circuit, two feedback components, an error suppressing circuit, and a selecting circuit. The sigma-delta modulating circuit generates two input voltages according to two input signals or one single-ended signal. The power stage circuit provides two output voltages according to the two input voltages or an error adjusting voltage. The two feedback components are respectively coupled to two output terminals of the power stage circuit and two input terminals of the sigma-delta modulating circuits. The error suppressing circuit is used for providing the error adjusting voltage according to the two input voltages. The selecting circuit selects outputs depending on whether the two input voltages corresponding to different logic levels or an identical logic level for adjusting the power stage circuit to suppress a mismatch error between the two feedback components.

10 Claims, 6 Drawing Sheets

(2B)

(2A)

| The logic level of ($V_{OUT1} - V_{OUT2}$) | $V_{OUT1}$ | $V_{OUT2}$ | $V_{err}$ |
|---|---|---|---|
| 1 | $+0.5V_p$ | $-0.5V_p$ | 0 |
| 0 | $+0.5V_p$ | $+0.5V_p$ | $V_p \times \Delta \times G \times Z_{ci}$ |
| 0 | $-0.5V_p$ | $-0.5V_p$ | $-V_p \times \Delta \times G \times Z_{ci}$ |
| -1 | $-0.5V_p$ | $+0.5V_p$ | 0 |

(4A)

(4B)

AMPLIFIER USING SIGMA-DELTA MODULATION AND METHOD FOR ADJUSTING ERRORS OF THE AMPLIFIER THEREOF

BACKGROUND OF THE INVENTION

1. Field of the Invention

The present invention relates to an amplifier using sigma-delta modulation, and more particularly, to an amplifier circuit and a related method for suppressing a mismatch error of feedback components according to logic levels of input voltages.

2. Description of the Prior Art

Recently, sigma-delta modulators have been widely used in amplifiers. Generally speaking, a one-bit quantizer is adopted in the sigma-delta modulator, wherein the one-bit quantizer generates a two-level output signal (i.e., −1 and 1). However, in some applications (such as audio amplifiers), the output signal of the quantizer toggles between −1 and 1 unceasingly even though its output power is quite low. Consequently, not only the efficiency of the amplifier is reduced, but also a large-scale LC filter is required to solve this issue. Since the present electronic products must satisfy the requirements of thin, light, and power-saved, there is no surplus space to contain the large-scale LC filter.

In order to solve the aforementioned problem, a middle level can be inserted in between the two-level output signal and the output signal of the quantizer can be transformed from two levels into three levels. However, feedback components on the feedback paths are not completely identical due to the manufacturing process issue. As a result, the mismatch error between the feedback components causes errors at the middle level, which affects the accuracy of the whole system.

SUMMARY OF THE INVENTION

It is therefore one of the objectives of the claimed invention to provide an amplifier using sigma-delta modulation and a related method, which solves the abovementioned problems by providing an error suppressing circuit and by adjusting output voltages of a power stage circuit according to input voltages generated from a sigma-delta modulator.

According to an exemplary embodiment of the present invention, an amplifier using sigma-delta modulation is provided. The amplifier consists of a sigma-delta modulating circuit, a power stage circuit, a pair of feedback components, an error suppressing circuit, and a selecting circuit. The sigma-delta modulating circuit generates two input voltages according to two input signals or one single-ended signal. The power stage circuit is coupled to the sigma-delta modulating circuit for providing two output voltages according to the two input voltages or an error adjusting voltage. The pair of feedback components consists of a first feedback component coupled between a first input terminal of the sigma-delta modulating circuit and a first output terminal of the power stage circuit and a second feedback component coupled between a second input terminal of the sigma-delta modulating circuit and a second output terminal of the power stage circuit, wherein a mismatch error exists between the first feedback component and the second feedback component. The error suppressing circuit is coupled to the sigma-delta modulating circuit and the power stage circuit for providing the error adjusting voltage according to the two input voltages. The selecting circuit is used for outputting the two input voltages to the power stage circuit when the two input voltages correspond to different logic levels, and for outputting the error adjusting voltage to the power stage circuit to suppress the mismatch error between the first feedback component and the second feedback component when the two input voltages correspond to an identical logic level.

According to another exemplary embodiment of the present invention, a method for adjusting a mismatch error of an amplifier using sigma-delta modulation is provided. The mismatch error exists between a first feedback component and a second feedback component of the amplifier. The method includes the steps of: generating two input voltages according to two input signals or one single-ended signal; generating an error adjusting voltage according to the two input voltages; determining whether the two input voltages correspond to an identical logic level or different logic levels to generate a judgment result; outputting the two input voltages when the judgment result indicates that the two input voltages correspond to different logic levels, and outputting the error adjusting voltage to suppress the mismatch error when the judgment result indicates that the two input voltages correspond to an identical logic level; and providing two output voltages according to the two input voltages or the error adjusting voltage.

According to another exemplary embodiment of the present invention, a circuit with component-mismatch error suppression functions is disclosed. The circuit consists of an input circuit, an output circuit, a feedback circuit, an error suppressing circuit, and a selecting circuit. The input circuit generates two input voltages according to two input signals or one single-ended signal. The output circuit is coupled to the input circuit for providing two output voltages according to the two input voltage or an error adjusting voltage. The feedback circuit consists of a first feedback component coupled between a first input terminal of the input circuit and a first output terminal of the output circuit and a second feedback component coupled between a second input terminal of the input circuit and a second output terminal of the output circuit, wherein a mismatch error exists between the first feedback component and the second feedback component. The error suppressing circuit is coupled to the input circuit and the output circuit for providing the error adjusting voltage according to the two input voltages. The selecting circuit is used for outputting the two input voltages to the output circuit when logic levels of the two input voltages correspond to a first predetermined condition, and for outputting the error adjusting voltage to the output circuit to suppress the mismatch error between the first feedback component and the second feedback component when the logic levels of the two input voltages correspond to a second predetermined condition, wherein the first predetermined condition is different from the second predetermined condition.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
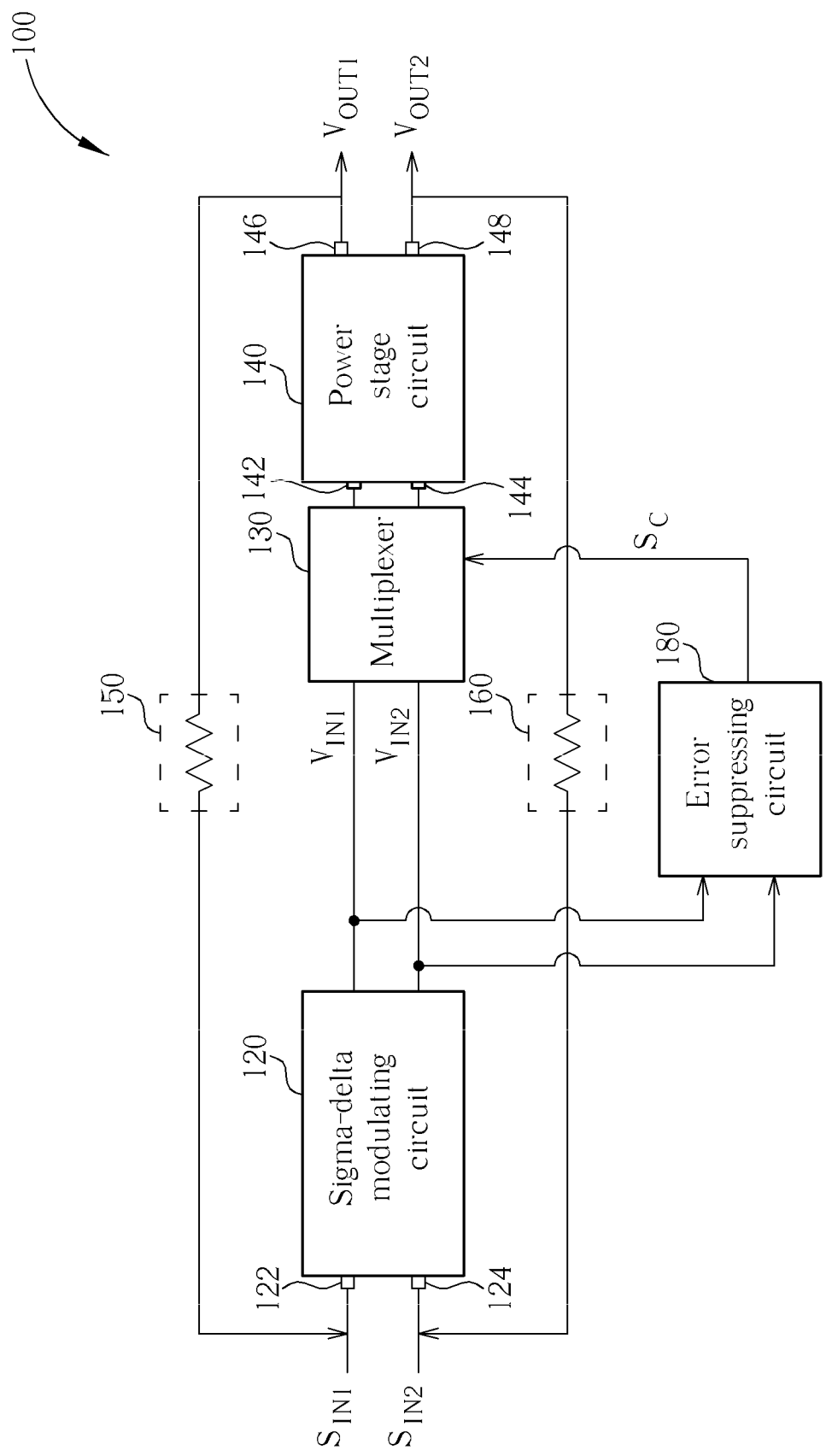
FIG. 1 is a diagram of a circuit with component-mismatch error suppression functions according to an embodiment of the present invention.

Please refer to FIG. 1. FIG. 1 is a diagram of a circuit 100 with component-mismatch error suppression functions according to an embodiment of the present invention. In this embodiment, the circuit 100 is implemented by an amplifier. The circuit 100 consists of an input circuit (being a sigma-delta modulating circuit 120 in this embodiment), a selecting circuit (being a multiplexer 130 in this embodiment), an output circuit (being a power stage circuit 140 in this embodiment), a first feedback component 150, a second feedback component 160, and an error suppressing circuit 180. As shown in FIG. 1, the sigma-delta modulating circuit 120 receives two input signals $S_{IN1}$ and $S_{IN2}$ (in another embodiment of the present invention, the sigma-delta modulating circuit 120 receives a single-ended signal) as well as feedback signals from output terminals 146 and 148 of the power stage circuit 140, and then generates two input voltages $V_{IN1}$ and $V_{IN2}$ according to the received signals. The multiplexer 130 receives the two input voltages $V_{IN1}$ and $V_{IN2}$ as well as an error adjusting voltage $S_C$ of the error suppressing circuit 180. When the two input voltages $V_{IN1}$ and $V_{IN2}$ correspond to different logic levels, the multiplexer 130 outputs the two input voltages $V_{IN1}$ and $V_{IN2}$ to two input terminals 142 and 144 of the power stage circuit 140; and when the two input voltages $V_{IN1}$ and $V_{IN2}$ correspond to an identical logic level, the multiplexer 130 outputs the error adjusting voltage $S_C$ to the two input terminals 142 and 144 of the power stage circuit 140. The power stage circuit 140 is coupled to the multiplexer 130 for providing two output voltages $V_{OUT1}$ and $V_{OUT2}$ according to the two input voltages $V_{IN1}$ and $V_{IN2}$ or the error adjusting voltage $S_C$. The first feedback component 150 is coupled between the input terminal 122 of the sigma-delta modulating circuit 120 and the output terminal 146 of the power stage circuit 140, and the second feedback component 160 is coupled between the input terminal 124 of the sigma-delta modulating circuit 120 and the output terminal 148 of the power stage circuit 140. Due to a mismatch error existing between the first feedback component 150 and the second feedback component 160, the two feedback signals fed back from the two output terminals 146 and 148 to the two input terminals 122 and 124 are also different from each other. The error suppressing circuit 180 is coupled to the sigma-delta modulating circuit 120 and the multiplexer 130, wherein input terminals of the error suppressing circuit 180 is coupled to the two input voltages $V_{IN1}$ and $V_{IN2}$ outputted from the sigma-delta modulating circuit 120. The error suppressing circuit 180 is used for generating the error adjusting voltage $S_C$ to the multiplexer 130 according to the two input voltages $V_{IN1}$ and $V_{IN2}$. Operations of the aforementioned elements and a relationship between each signal will be further detailed in the following embodiments.

Please note that the first feedback component 150 and the second feedback component 160 mentioned above can be respectively implemented by a resistor, but the present invention is not limited to this only and they can be implemented by other elements. In addition, the sigma-delta modulating circuit 120 can be any arbitrary arrangements or combinations of integrators, adders, filters, and quantizers, and a person skilled in the art should appreciate that the number of each element is not limited. Furthermore, the amplifier 100 can be a D-class amplifier, but this is not a limitation of the present invention and can be another type of amplifier.

Figure 2:
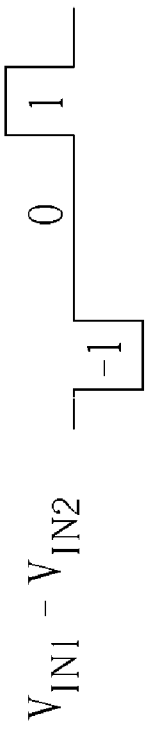
FIG. 2 (including 2A and 2B) is a diagram showing a relationship between the two input voltages.
Figure 2:
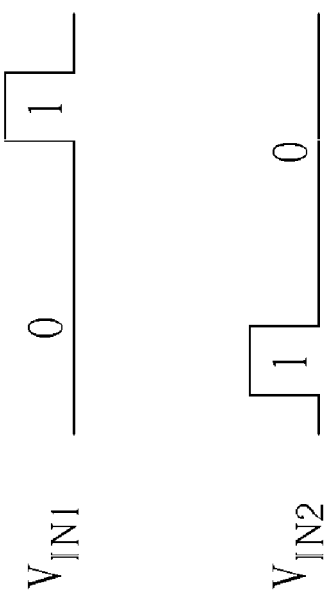

Please refer to FIG. 2. FIG. 2 (including 2A and 2B) is a diagram showing a relationship between the two input voltages $V_{IN1}$ and $V_{IN2}$. As shown in 2A, the two input voltages $V_{IN1}$ and $V_{IN2}$ each has two logic levels: —0 (the first logic level) and 1 (the second logic level). As shown in 2B, a difference ($V_{IN1}-V_{IN2}$) between the two input voltages $V_{IN1}$ and $V_{IN2}$ is a three-level signal, which has three levels: $-1$, $0$, and $1$. The level 0 represents that the two input voltages $V_{IN1}$ and $V_{IN2}$ have the same logic level (i.e., both the input voltages $V_{IN1}$ and $V_{IN2}$ correspond to the first logic level or the second logic level). Similarly, because the two output voltages $V_{OUT1}$ and $V_{OUT2}$ are generated depending on the two input voltages $V_{IN1}$ and $V_{IN2}$, a difference ($V_{OUT1}-V_{OUT2}$) of the two output voltages $V_{OUT1}$ and $V_{OUT2}$ is also a three-level signal, which has three levels $-1$, $0$, and $1$. The level 0 represents that the two output voltages $V_{OUT1}$ and $V_{OUT2}$ have the same logic level (i.e., both the output voltages $V_{OUT1}$ and $V_{OUT2}$ correspond to the first logic level or the second logic level). Please note that, the three levels of the abovementioned difference ($V_{IN1}-V_{IN2}$) of the two input voltages $V_{IN1}$ and $V_{IN2}$ and the three levels of the difference ($V_{OUT1}-V_{OUT2}$) of the two output voltages $V_{OUT1}$ and $V_{OUT2}$ have the same physical meanings.

Figure 3:
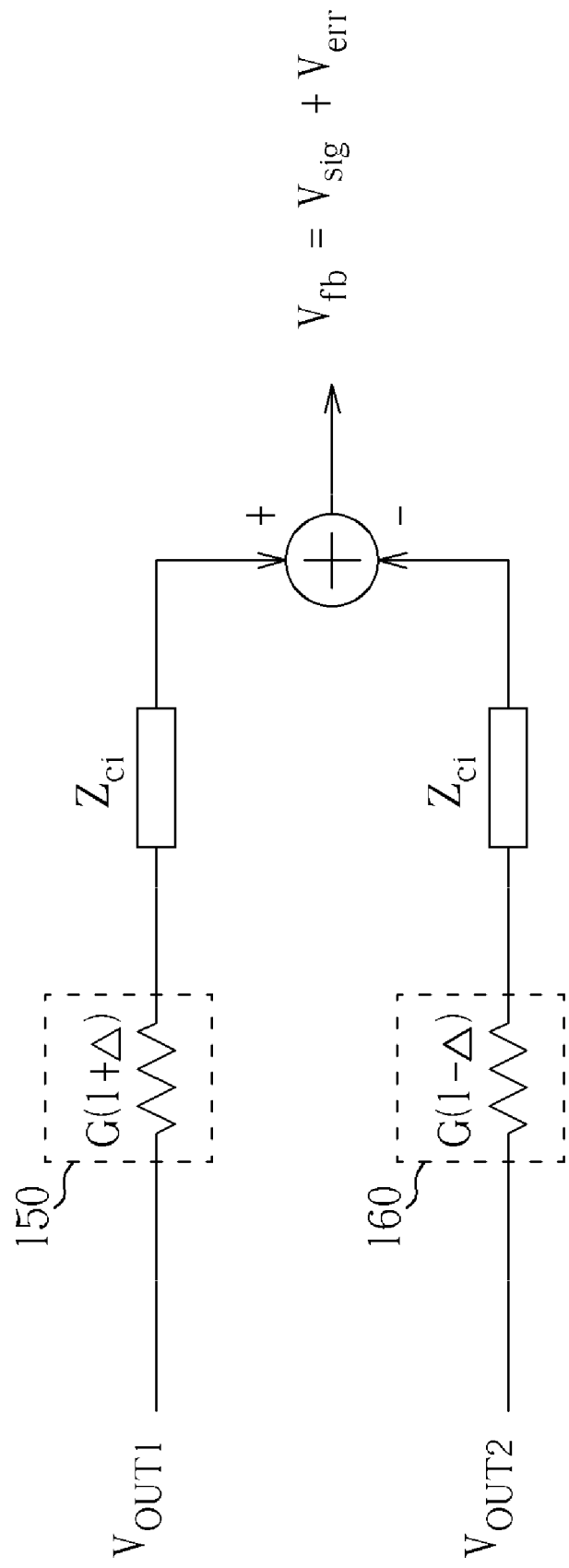
FIG. 3 is a diagram illustrating an error voltage caused by the mismatch error between the first feedback component and the second feedback component shown in FIG. 1.

Please refer to FIG. 3. FIG. 3 is a diagram illustrating an error voltage caused by the mismatch error between the first feedback component 150 and the second feedback component 160 shown in FIG. 1. As shown in FIG. 3, assuming that a conductance value of the first feedback component 150 is represented by $G(1+\Delta)$ and a conductance value of the second feedback component 160 is represented by $G(1-\Delta)$, wherein $\Delta$ represents the mismatch error between the first feedback component 150 and the second feedback component 160. In addition, the symbol $Z_{ci}$ is used for representing an internal impedance of the sigma-delta modulating circuit 120, and $+0.5V_P$ as well as $-0.5V_P$ are respectively used for representing the high logic level and the low logic level of the output voltages $V_{OUT1}$ and $V_{OUT2}$. Therefore, the feedback signal Vfb passing through the feedback paths can be obtained by the following equation:

$$\begin{aligned} Vfb &= Vsig + Verr \\ &= V_{OUT1} \times G(1+\Delta) \times Z_{ci} - V_{OUT2} \times G(1-\Delta) \times Z_{ci} \\ &= (V_{OUT1} - V_{OUT2}) \times G \times Z_{ci} - (V_{OUT1} + V_{OUT2}) \times \\ &\quad \Delta \times G \times Z_{ci}. \end{aligned} \qquad (1)$$

As can be seen from the equation (1), the feedback signal Vfb consists of two parts—the signal voltage Vsig and the error voltage Verr caused by the mismatch error between the feedback components, wherein the error voltage Verr can be represented by the term $(V_{OUT1}+V_{OUT2})\times\Delta\times G\times Z_{ci}$.

Figure 4:
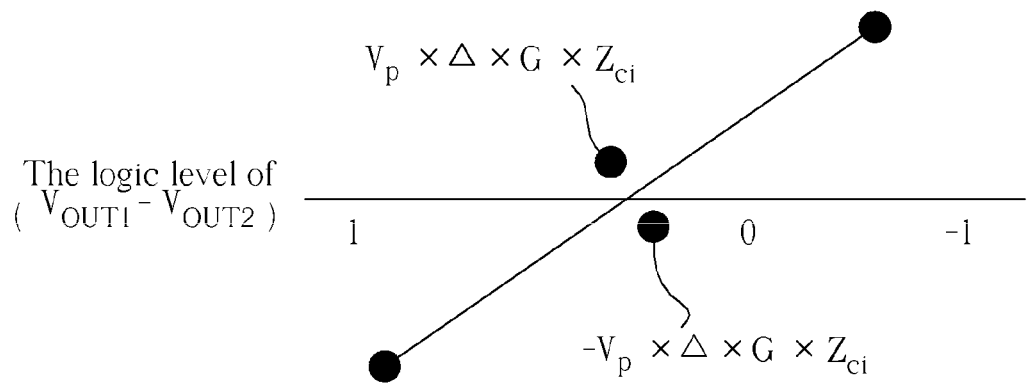
FIG. 4 (including 4A and 4B) is a diagram illustrating the voltage level of the error voltage shown in FIG. 3 when the voltage difference between the two output voltages corresponds to different logic levels.

Please refer to FIG. 4. FIG. 4 (including 4A and 4B) is a diagram illustrating the voltage level of the error voltage Verr shown in FIG. 3 when the voltage difference ($V_{OUT1}-V_{OUT2}$) between the two output voltages $V_{OUT1}$ and $V_{OUT2}$ corresponds to different logic levels. As shown in 4A, $+0.5V_P$ and $-0.5V_P$ are respectively used for representing the output voltages $V_{OUT1}$ and $V_{OUT2}$. If $+0.5V_P$ and $-0.5V_P$ are substituted into the equation of the error voltage Verr, the voltage level of the error voltage Verr when the voltage difference ($V_{OUT1}-V_{OUT2}$) between the two output voltages $V_{OUT1}$ and $V_{OUT2}$ corresponds to different logic levels (i.e., −1, 0, and 1) can be obtained. As can be known from the table listed in 4A and the graph shown in 4B, the error voltage Verr is caused by the mismatch error between the two feedback components 150 and 160 when the difference ($V_{OUT1}-V_{OUT2}$) between the two output voltages $V_{OUT1}$ and $V_{OUT2}$ corresponds to logic level 0. In other words, when the two output voltages $V_{OUT1}$ and $V_{OUT2}$ have the same logic level (i.e., $V_{OUT1}=V_{OUT2}=+0.5V_p$ or $V_{OUT1}=V_{OUT2}=-0.5V_p$), the error voltage Verr is caused by the mismatch error between the two feedback components 150 and 160.

Figure 5:
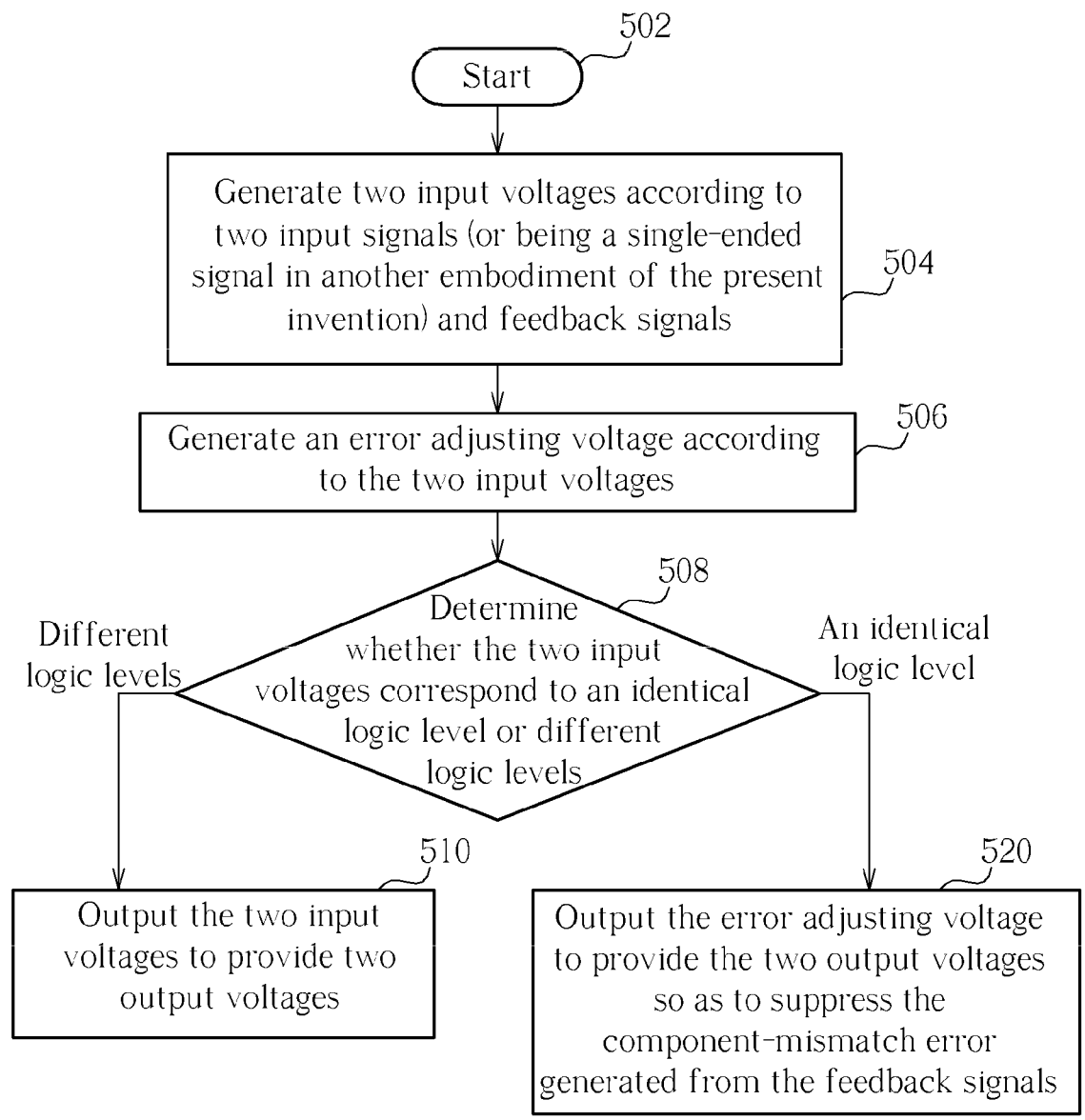
FIG. 5 is a flowchart illustrating a method for adjusting a mismatch error of an amplifier using sigma-delta modulation according to an exemplary embodiment of the present invention.

Please refer to FIG. 5. FIG. 5 is a flowchart illustrating a method for adjusting a mismatch error of an amplifier using sigma-delta modulation according to an exemplary embodiment of the present invention. Please note that the following steps are not limited to be performed according to the exact sequence shown in FIG. 5 if a roughly identical result can be obtained. The method includes the following steps:

Step 502: Start.

Step 504: Generate two input voltages according to two input signals (or being a single-ended signal in another embodiment of the present invention) and feedback signals.

Step 506: Generate an error adjusting voltage according to the two input voltages, wherein the error adjusting voltage corresponds to logic level 1 or logic level 0.

Step 508: Determine whether the two input voltages correspond to an identical logic level or different logic levels. If the two input voltages are determined to have different logic levels, go to Step 510; otherwise, go to Step 520.

Step 510: When the two input voltages correspond to different logic levels, output the two input voltages to provide two output voltages.

Step 520: When the two input voltages correspond to the same logic level, output the error adjusting voltage to provide the two output voltages so as to suppress the component-mismatch error generated from the feedback signals.

The following description details how each element operates by collocating the steps shown in FIG. 5 and the elements shown in FIG. 1. In Step 504, the sigma-delta modulating circuit 120 generates the two input voltages $V_{IN1}$ and $V_{IN2}$ according to the two input signals $S_{IN1}$ and $S_{IN2}$ and the feedback signals. The error suppressing circuit 180 then generates the error adjusting voltage $S_C$ to the multiplexer 130 according to the two input voltages $V_{IN1}$ and $V_{IN2}$ (Step 506). The multiplexer 130 selects to output the two input voltages $V_{IN1}$ and $V_{IN2}$ or the error adjusting voltage $S_C$ depending on a judgment result of determining whether the two input voltages $V_{IN1}$ and $V_{IN2}$ correspond to an identical logic level or different logic levels. When the two input voltages $V_{IN1}$ and $V_{IN2}$ correspond to different logic levels, the multiplexer 130 outputs the two input voltages $V_{IN1}$ and $V_{IN2}$ to the power stage circuit 140 for providing the two output voltages $V_{OUT1}$ and $V_{OUT2}$ (Step 510); and when the two input voltages $V_{IN1}$ and $V_{IN2}$ correspond to the same logic level, the multiplexer 130 output the error adjusting voltage $S_C$ to the power stage circuit 140 as the two output voltages $V_{OUT1}$ and $V_{OUT2}$ so as to suppress the component-mismatch error generated from the feedback signals (Step 520).

It should be noted that the steps of the flowchart mentioned in FIG. 5 above are merely a practicable embodiment of the present invention, and should not be considered as a limitation of the present invention. The method can include other intermediate steps or can merge several steps into a single step without departing from the spirit of the present invention, which should also belong to the scope of the present invention.

Figure 6:
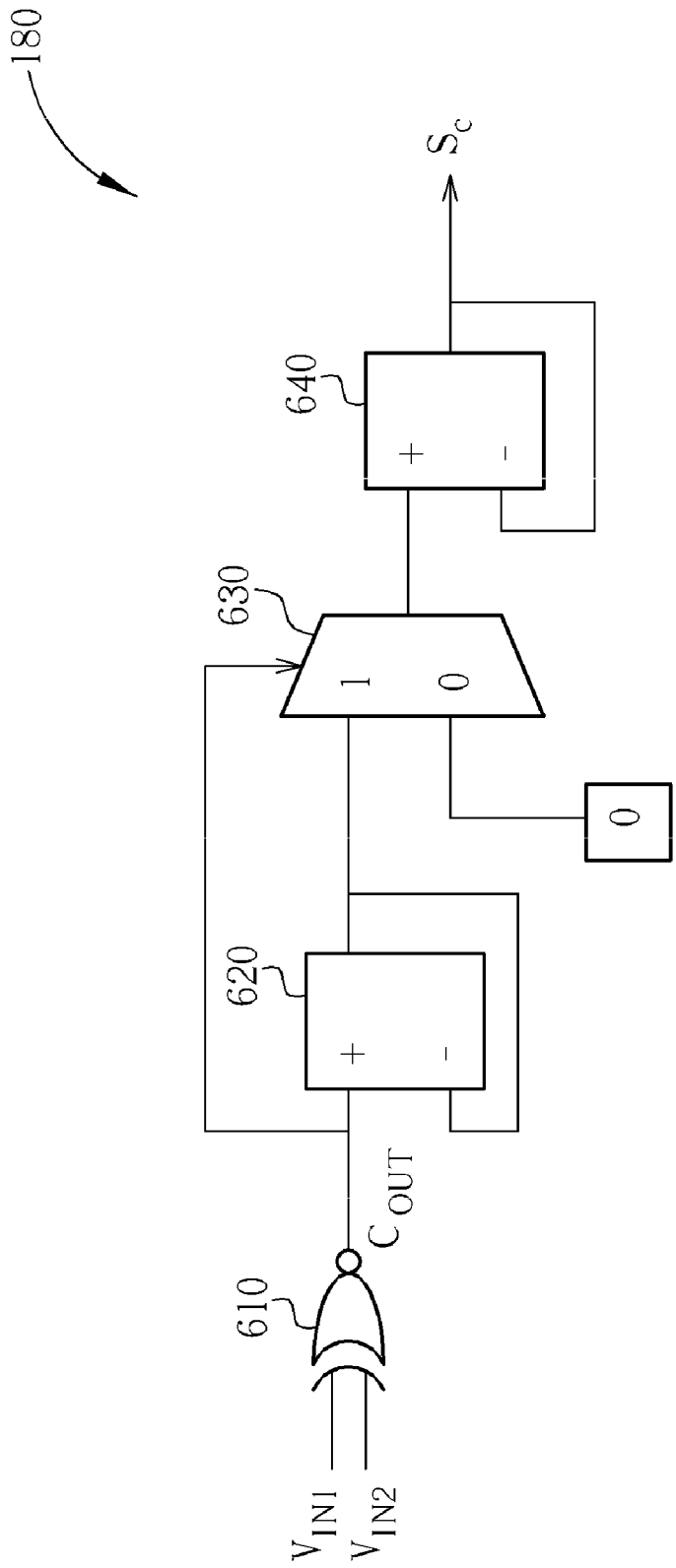
FIG. 6 is a diagram of an example of the error suppressing circuit shown in FIG. 1.

Please refer to FIG. 6. FIG. 6 is a diagram of an example of the error suppressing circuit 180 shown in FIG. 1. As shown in FIG. 6, the error suppressing circuit 180 is implemented by a $2^{nd}$ shaping function, which includes an XNOR gate 610, a first-order adder 620 (being an one-bit adder in this embodiment), a selector 630, and a second-order adder 640 (being an one-bit adder in this embodiment). First, the two input voltages $V_{IN1}$ and $V_{IN2}$ of the sigma-delta modulating circuit 120 pass through the XNOR gate 610 so as to generate a control output $C_{OUT}$. When the two input voltages $V_{IN1}$ and $V_{IN2}$ have the same logic level, the control output $C_{OUT}$ is set as logic 1 and the error suppressing circuit 180 is started by the selector 630. When the two input voltages $V_{IN1}$ and $V_{IN2}$ correspond to different logic levels, the control output $C_{OUT}$ is set as logic 0 and the error suppressing circuit 180 is not started by the selector 630. Finally, the error suppressing circuit 180 outputs the error adjusting voltage $S_C$ to the multiplexer 130 shown in FIG. 1. The multiplexer 130 decides to output the two input voltages $V_{IN1}$ and $V_{IN2}$ to the power stage circuit 140 as the two output voltages $V_{OUT1}$ and $V_{OUT2}$ or to output the error adjusting voltage $S_C$ to the power stage circuit 140 as the two output voltages $V_{OUT1}$ and $V_{OUT2}$ for adjusting the middle level of the power stage circuit 140 so as to suppress the mismatch error between the first feedback component 150 and the second feedback component 160 depending on whether the two input voltages $V_{IN1}$ and $V_{IN2}$ correspond to an identical logic level or different logic levels. In this embodiment, the multiplexer 130 can decide to output the two input voltages $V_{IN1}$ and $V_{IN2}$ or the error adjusting voltage $S_C$ according to the control output $C_{OUT}$ of the XNOR gate 610. When the control output $C_{OUT}$ is set as logic 0, the multiplexer 130 outputs the two input voltages $V_{IN1}$ and $V_{IN2}$ to the power stage circuit 140. When the control output $C_{OUT}$ is set as logic 1, the multiplexer 130 outputs the error adjusting voltage $S_C$ to the power stage circuit 140. Furthermore, in this embodiment, the multiplexer 130 consists of two multiplexing units, wherein one multiplexing unit is used for determining to output the input voltage $V_{IN1}$ or the error adjusting voltage $S_C$ to a first input terminal of the power stage circuit 140 according to the control output $C_{OUT}$, and the other multiplexing unit is used for determining to output the input voltage $V_{IN2}$ or the error adjusting voltage $S_C$ to a second input terminal of the power stage circuit 140 according to the control output $C_{OUT}$.

Please note that the error suppressing circuit 180 mentioned above is merely a practical embodiment of the present invention, and in no way should be considered to be limitations of the scope of the present invention. Those skilled in the art should appreciate that the error suppressing circuit 180 can be implemented by adopting a dynamic element matching architecture or other calibration mechanisms. Furthermore, although the abovementioned embodiments take an example of generating two three-level output voltages according to the two input voltages, but this should not be considered as a limitation of the present invention. Those skilled in the art have certainly been enabled to implement a calibration mechanism of generating multi-level output signals (three levels or more than three levels) according to a plurality (two or more than two) of input voltages.

The abovementioned embodiments are presented merely for describing features of the present invention, and in no way should be considered to be limitations of the scope of the present invention. In summary, the present invention provides an amplifier using sigma-delta modulation and a related method for adjusting the mismatch error of the amplifier. The middle level of the power stage circuit 140 is adjusted according to the outputs of the sigma-delta modulating circuit 120, which can suppress the mismatch error between two feedback elements and can improve the accuracy of the whole system. In addition, a problem that the difference ($V_{OUT1}-V_{OUT2}$) between the two output voltages of the power stage circuit 140 toggles between −1 and 1 will not happen. Therefore, not only can the efficiency of the amplifier be improved, but also can an extra large-scale LC filter be omitted. For a portable electronic device, its area as well as its cost can be saved.

Those skilled in the art will readily observe that numerous modifications and alterations of the device and method may be made while retaining the teachings of the invention.

What is claimed is:

1. An amplifier using sigma-delta modulation, comprising:
   a sigma-delta modulating circuit, for generating two input voltages according to two input signals or one single-ended signal;
   a power stage circuit, coupled to the sigma-delta modulating circuit, for providing two output voltages according to the two input voltages or an error adjusting voltage;
   a pair of feedback components, comprising a first feedback component coupled between a first input terminal of the sigma-delta modulating circuit and a first output terminal of the power stage circuit and a second feedback component coupled between a second input terminal of the sigma-delta modulating circuit and a second output terminal of the power stage circuit, wherein a mismatch error exists between the first feedback component and the second feedback component;
   an error suppressing circuit, coupled to the sigma-delta modulating circuit and the power stage circuit, for providing the error adjusting voltage according to the two input voltages; and
   a selecting circuit, for outputting the two input voltages to the power stage circuit when the two input voltages correspond to different logic levels and for outputting the error adjusting voltage to the power stage circuit to suppress the mismatch error between the first feedback component and the second feedback component when the two input voltages correspond to an identical logic level.

2. The amplifier of claim 1, wherein a difference between the two output voltages corresponds to three levels −1, 0, and 1.

3. The amplifier of claim 2, wherein the error suppressing circuit is started to suppress the mismatch error between the first feedback component and the second feedback component when the two output voltages correspond to an identical logic level.

4. The amplifier of claim 1, wherein the error suppressing circuit is started to suppress the mismatch error between the first feedback component and the second feedback component only when the two input voltages correspond to an identical logic level.

5. The amplifier of claim 1, wherein the error suppressing circuit adopts a dynamic element matching architecture.

6. The amplifier of claim 1, being a D-class amplifier.

7. A method for adjusting a mismatch error of an amplifier using sigma-delta modulation, the mismatch error existing between a first feedback component and a second feedback component of the amplifier, the method comprising:
   generating two input voltages according to two input signals or one single-ended signal;
   generating an error adjusting voltage according to the two input voltages;
   determining whether the two input voltages correspond to an identical logic level or different logic levels to generate a judgment result;
   outputting the two input voltages when the judgment result indicates that the two input voltages correspond to different logic levels, and outputting the error adjusting voltage to suppress the mismatch error when the judgment result indicates that the two input voltages correspond to an identical logic level; and
   providing two output voltages according to the two input voltages or the error adjusting voltage.

8. The method of claim 7, wherein a difference between the two output voltages corresponds to three levels −1, 0, and 1.

9. A circuit with component-mismatch error suppression functions, comprising:
   an input circuit, for generating two input voltages according to two input signals or one single-ended signal;
   an output circuit, coupled to the input circuit, for providing two output voltages according to the two input voltages or an error adjusting voltage;
   a feedback circuit, comprising a first feedback component coupled between a first input terminal of the input circuit and a first output terminal of the output circuit and a second feedback component coupled between a second input terminal of the input circuit and a second output terminal of the output circuit, wherein a mismatch error exists between the first feedback component and the second feedback component;
   an error suppressing circuit, coupled to the input circuit and the output circuit, for providing the error adjusting voltage according to the two input voltages; and
   a selecting circuit, for outputting the two input voltages to the output circuit when logic levels of the two input voltages correspond to a first predetermined condition and for outputting the error adjusting voltage to the output circuit to suppress the mismatch error between the first feedback component and the second feedback component when the logic levels of the two input voltages correspond to a second predetermined condition, wherein the first predetermined condition is different from the second predetermined condition.

10. The circuit of claim 9, wherein the first predetermined condition is that the two input voltages correspond to different logic levels; and the second predetermined condition is that the two input voltages correspond to an identical logic level.

* * * * *